United States Patent
Igarashi

(10) Patent No.: US 12,272,542 B2
(45) Date of Patent: Apr. 8, 2025

(54) APPARATUS FOR CLEANING SEMICONDUCTOR SILICON WAFER AND METHOD FOR CLEANING SEMICONDUCTOR SILICON WAFER

(71) Applicant: SHIN-ETSU HANDOTAI CO., LTD., Tokyo (JP)

(72) Inventor: Kensaku Igarashi, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 693 days.

(21) Appl. No.: 17/275,145

(22) PCT Filed: Sep. 17, 2019

(86) PCT No.: PCT/JP2019/036261
§ 371 (c)(1),
(2) Date: Mar. 10, 2021

(87) PCT Pub. No.: WO2020/075448
PCT Pub. Date: Apr. 16, 2020

(65) Prior Publication Data
US 2022/0059343 A1    Feb. 24, 2022

(30) Foreign Application Priority Data

Oct. 11, 2018    (JP) ................ 2018-192672

(51) Int. Cl.
*H01L 21/02* (2006.01)
*H01L 21/304* (2006.01)
*H01L 21/687* (2006.01)

(52) U.S. Cl.
CPC .... *H01L 21/02052* (2013.01); *H01L 21/0201* (2013.01); *H01L 21/02381* (2013.01); *H01L 21/304* (2013.01); *H01L 21/68735* (2013.01)

(58) Field of Classification Search
CPC .......... H01L 21/02052; H01L 21/0201; H01L 21/304; H01L 21/67057
See application file for complete search history.

(56) References Cited

U.S. PATENT DOCUMENTS

2007/0228524 A1    10/2007    Hayashida et al.

FOREIGN PATENT DOCUMENTS

| DE | 10239773 B3 | 2/2004 |
|---|---|---|
| JP | H08107100 A * | 10/1994 |

(Continued)

OTHER PUBLICATIONS

Machine translation: JPH08107100A; Suzuki et al. (Year: 1994).*

(Continued)

*Primary Examiner* — Natasha N Campbell
(74) *Attorney, Agent, or Firm* — Oliff PLC

(57) ABSTRACT

A method for cleaning a semiconductor silicon wafer including: an ozone water treatment step after polishing in ozone water, a step of performing a first ultrasonic-wave-ozone-water treatment of cleaning at room temperature while immersing in ozone water and applying ultrasonic waves; and a step of performing a second ultrasonic-wave-ozone-water treatment of, after the step of performing the first ultrasonic-wave-ozone-water treatment, pulling out the semiconductor silicon wafer from the ozone water, performing rotation process, and cleaning at room temperature while immersing in ozone water and applying ultrasonic waves; wherein the step of performing the second ultrasonic-wave-ozone-water treatment is performed, and a hydrofluoric acid treatment step and an ozone water treatment step are performed. Accordingly, a method for cleaning a semiconductor silicon wafer and an apparatus for cleaning by which pro- (Continued)

jecting defects on the wafer surface and the degradation of surface roughness can be suppressed to improve wafer quality reduce costs.

14 Claims, 3 Drawing Sheets

(56) References Cited

FOREIGN PATENT DOCUMENTS

| JP | 2000-164552 A | | 6/2000 |
|---|---|---|---|
| JP | 2001-102343 A | | 4/2001 |
| JP | 2003010795 A | * | 1/2003 |
| JP | 2007-273911 A | | 10/2007 |
| JP | 2015-023069 A | | 2/2015 |
| JP | 2017-219409 A | | 12/2017 |
| KR | 20050105854 A | | 11/2005 |
| KR | 10-2010-0049856 A | | 5/2010 |

OTHER PUBLICATIONS

Machine translation: JP2003010795; Yamazaki et al. (Year: 2003).*
Jun. 15, 2022 Search Report issued in European Patent Application No. 19871349.7.
Dec. 3, 2019 International Search Report issued in International Patent Application No. PCT/JP2019/036261.
Jan. 25, 2024 Office Action issued in Korean Patent Application No. 10-2021-7008258.
Jul. 11, 2024 Office Action issued in Chinese Patent Application No. 201980058971.2.
Aug. 20, 2024 Office Action issued in Korean Patent Application No. 10-2021-7008258.

* cited by examiner

[FIG. 1]
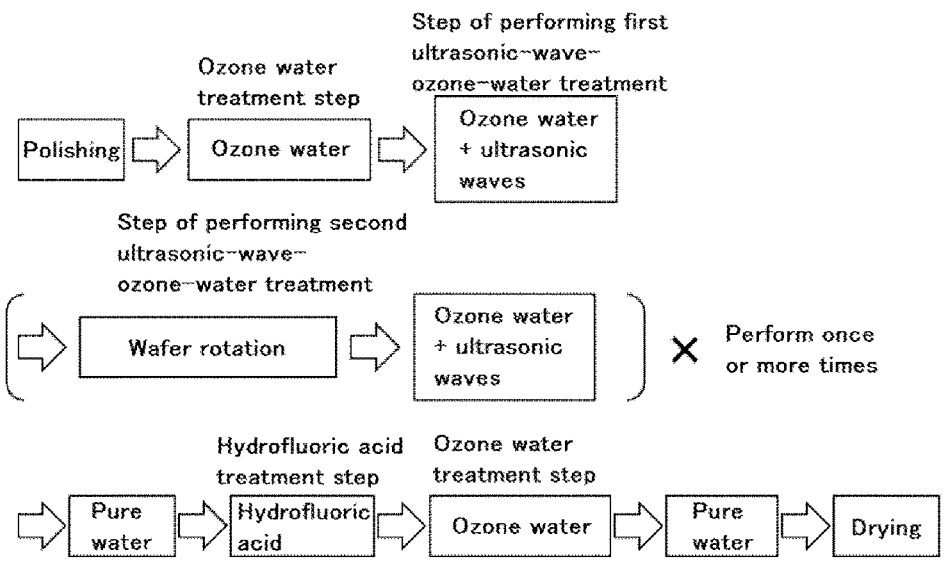
[FIG. 2]
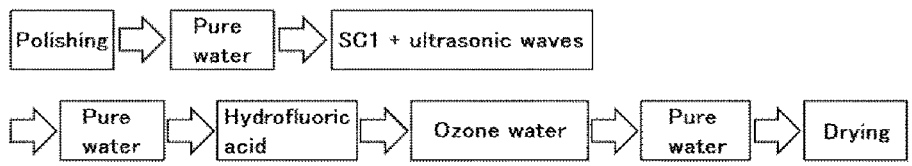
[FIG. 3]
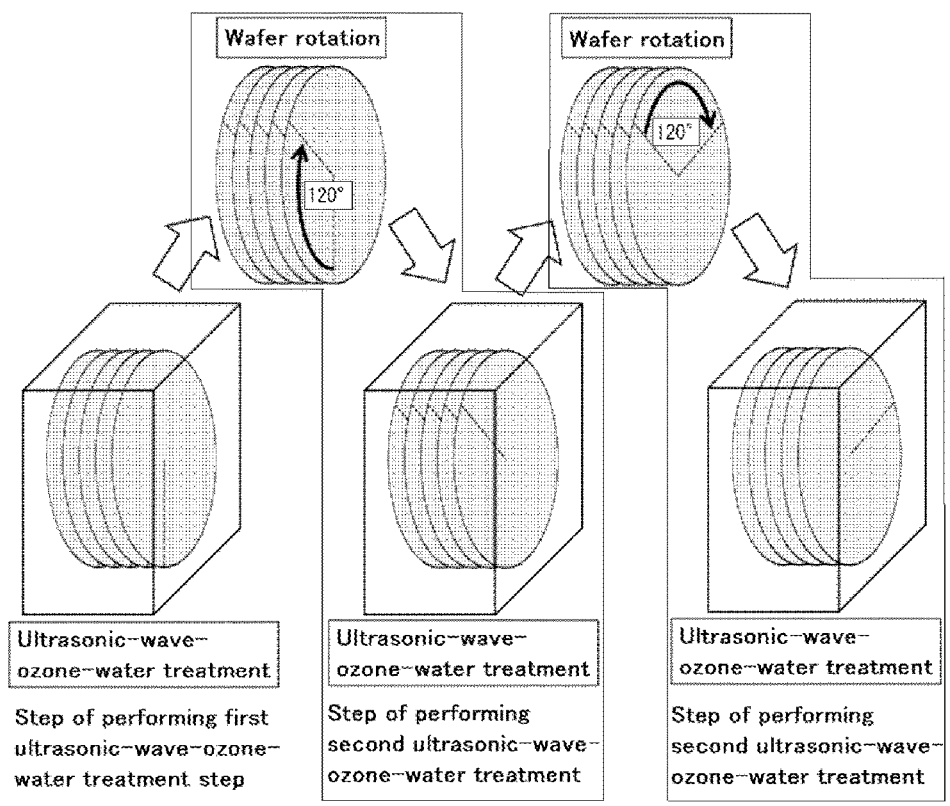

[FIG. 4]
Rotation angle of wafer
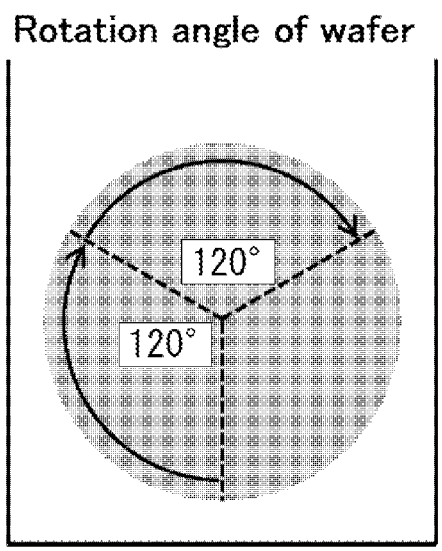
[FIG. 5]
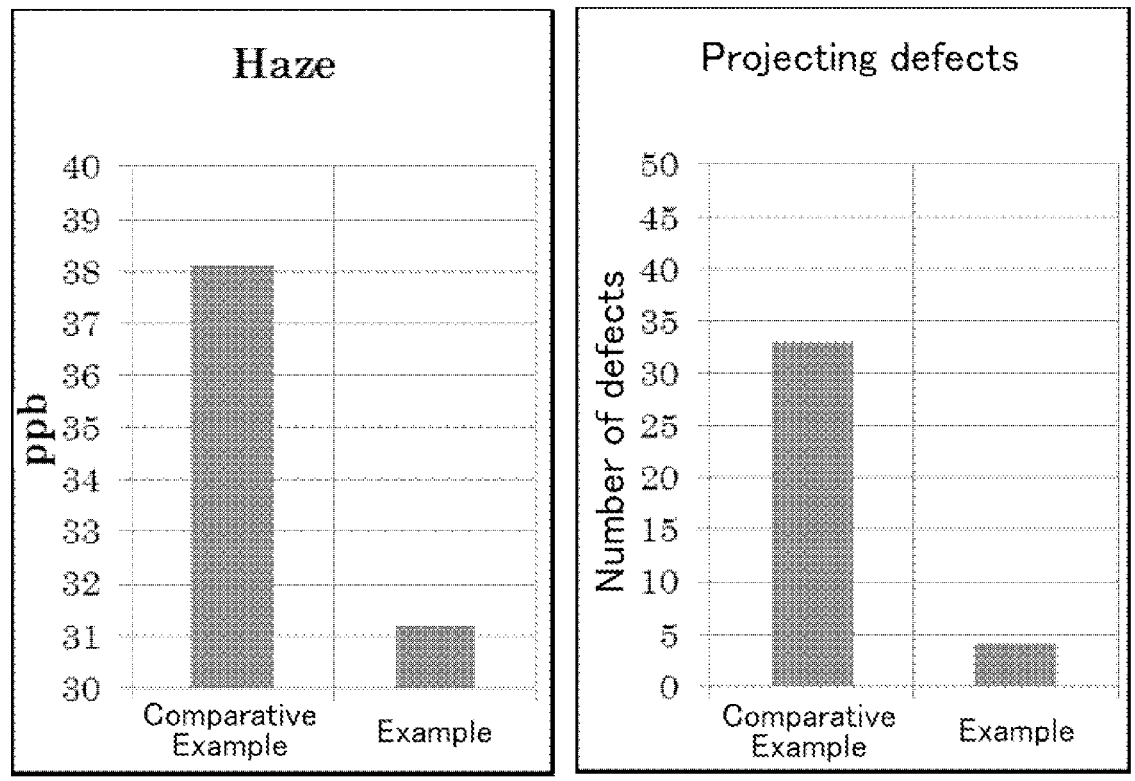

[FIG. 6]
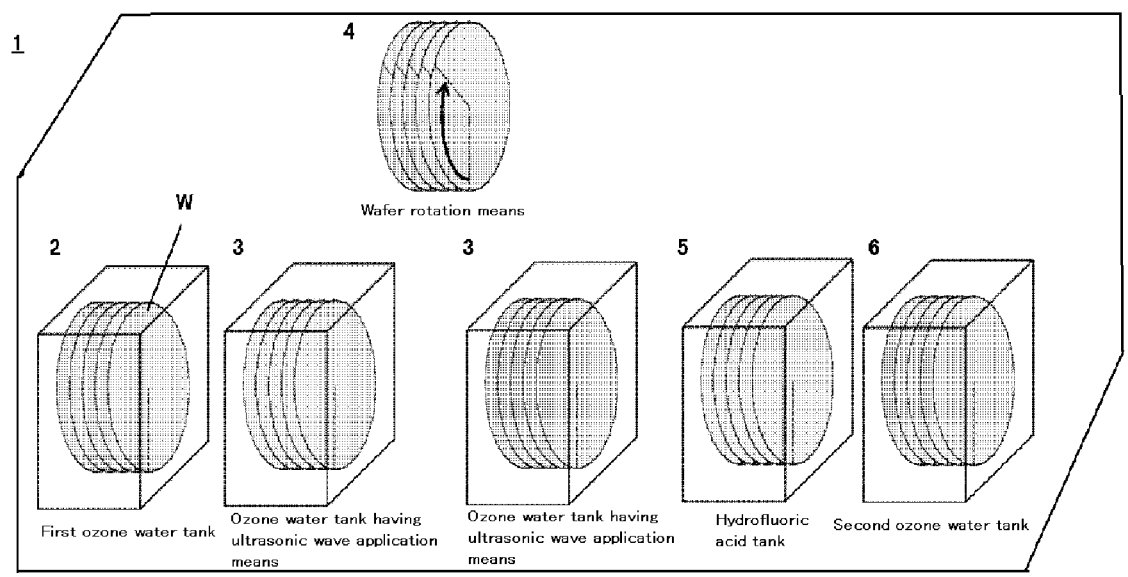

APPARATUS FOR CLEANING SEMICONDUCTOR SILICON WAFER AND METHOD FOR CLEANING SEMICONDUCTOR SILICON WAFER

TECHNICAL FIELD

The present invention relates to: an apparatus for cleaning a semiconductor silicon wafer; and a method for cleaning a semiconductor silicon wafer.

BACKGROUND ART

Conventionally, when a wafer having a polishing agent adhered to the wafer surface immediately after polishing is cleaned in a batch (cleaned by dipping), it has been common and necessary to perform a cleaning using SC1 (a mixed solution of ammonia water and hydrogen peroxide water) in order to remove organic matter or silica particles contained in the polishing agent, etc.

FIG. 2 is a diagram showing an example of a conventional flow for cleaning a semiconductor silicon wafer after polishing.

In a conventional cleaning flow, after removing, from a wafer after polishing, a polishing agent with SC1 and ultrasonic waves, a pure water treatment and removal of particles and metal impurity by oxide film removal using hydrofluoric acid are performed, and after forming an oxide film by reoxidation by ozone water, a pure water treatment is performed, and then drying is performed, as shown in FIG. 2.

CITATION LIST

Patent Literature

Patent Document 1: Japanese Patent Application No. 2015-023069

SUMMARY OF INVENTION

Technical Problem

However, SC1 is a chemical solution that is accompanied by anisotropic etching, and there have been problems that projecting defects are generated on a wafer surface and that surface roughness is degraded.

In addition, a chemical like SC1 has a high environmental load and requires wastewater treatment, and requires a temperature adjustment mechanism, and therefore, there has been a problem that costs are extremely high.

Meanwhile, it is disclosed that in a spin-cleaning method, a neutral aqueous solution of a polymer having a molecular weight of 10,000 or less is supplied to a substrate, the polymer is removed from the substrate, and cleaning is performed with a solution having ozone dissolved (Patent Document 1).

However, there have been no suggestions of methods for solving the above problems in methods for cleaning in a batch.

The present invention has been made to solve the above problems, and an object thereof is to provide a method for cleaning a semiconductor silicon wafer and an apparatus for cleaning the same by which the generation of projecting defects on the wafer surface and the degradation of surface roughness in a conventional method for cleaning a semiconductor silicon wafer can be suppressed, and wafer quality can be improved.

In addition, it is also an object of the present invention to provide a method for cleaning a semiconductor silicon wafer and an apparatus for cleaning the same by which costs can be reduced compared to what is conventional.

Solution to Problem

To solve the above problems, the present invention provides a method for cleaning a semiconductor silicon wafer for cleaning a semiconductor silicon wafer after polishing, the method comprising:

an ozone water treatment step after polishing, of immersing, in ozone water, the semiconductor silicon wafer after polishing;

a step of performing a first ultrasonic-wave-ozone-water treatment of cleaning the semiconductor silicon wafer at room temperature while immersing in ozone water and applying ultrasonic waves; and a step of performing a second ultrasonic-wave-ozone-water treatment of, after the step of performing the first ultrasonic-wave-ozone-water treatment, pulling out the semiconductor silicon wafer from the ozone water, performing a wafer rotation process of rotating, and cleaning the semiconductor silicon wafer after the wafer rotation process again at room temperature while immersing in ozone water and applying ultrasonic waves; wherein the step of performing the second ultrasonic-wave-ozone-water treatment is performed once or more times, and subsequently, a hydrofluoric acid treatment step of immersing the semiconductor silicon wafer in hydrofluoric acid and an ozone water treatment step of immersing the semiconductor silicon wafer after the hydrofluoric acid treatment step in ozone water are performed.

According to such a method for cleaning a semiconductor silicon wafer, a polishing agent adhered not only to the wafer surface but also to an edge portion can be removed efficiently by rotating the wafer, and wafer quality can be improved.

In addition, since the cleaning is not accompanied by etching of the wafer, surface roughness and projecting defects can be improved.

Furthermore, since treatment at room temperature is possible by using ozone water, costs can be reduced.

Furthermore, in this case, when the step of performing the second ultrasonic-wave-ozone-water treatment is performed "n" times, a rotation angle of the semiconductor silicon wafer in the wafer rotation process is preferably $360°/(1+n)$.

According to such a cleaning method, ultrasonic waves can be applied uniformly, not only in the wafer surface, but also in the edge portion, and wafer quality can be further improved.

Furthermore, in this case, the step of performing the second ultrasonic-wave-ozone-water treatment is preferably performed twice.

According to such a cleaning method, decrease in throughput does not occur in the actual manufacturing process.

Furthermore, in this case, a pure water treatment step of immersing the semiconductor silicon wafer in pure water is preferably comprised, wherein the pure water treatment step is preferably performed at least before the hydrofluoric acid treatment step.

According to such a cleaning method, wafer quality can be improved more certainly.

Furthermore, in this case, out of waste liquids produced in the steps, waste liquids of ozone water and pure water are preferably collected and reused.

Such a cleaning method leads to cost reduction, since waste liquid can be reused.

Furthermore, in this case, out of the steps, an ozone water concentration in the steps where ozone water is used is preferably 10 ppm or more.

According to such a cleaning method, wafer quality can be improved more certainly.

Furthermore, in this case, the semiconductor silicon wafer after polishing is preferably a semiconductor silicon wafer polished using silica as a polishing agent.

According to such a cleaning method, not only organic matter but also silica is removed by the steps of performing the first and second ultrasonic-wave-ozone-water treatments, and subsequently, a natural oxide film is removed by the hydrofluoric acid treatment, so that silica and metal contamination can be eliminated. Accordingly, wafer quality can be improved more certainly.

Furthermore, the present invention provides an apparatus for cleaning a semiconductor silicon wafer for cleaning a semiconductor silicon wafer after polishing, the apparatus comprising:

a first ozone water tank filled with ozone water for immersing, in the ozone water, the semiconductor silicon wafer after polishing;

a hydrofluoric acid tank filled with hydrofluoric acid for immersing the semiconductor silicon wafer in the hydrofluoric acid;

a second ozone water tank filled with ozone water for immersing, in the ozone water, the semiconductor silicon wafer after immersing in the hydrofluoric acid;

an ozone water tank having an ultrasonic wave application means for immersing the semiconductor silicon wafer in ozone water and cleaning while applying ultrasonic waves; and a wafer rotation means for taking the semiconductor silicon wafer out of the ozone water tank having the ultrasonic wave application means and rotating.

According to such an apparatus for cleaning a semiconductor silicon wafer, a polishing agent adhered not only to the wafer surface but also to an edge portion can be removed efficiently by rotating the wafer, and wafer quality can be improved.

In addition, cleaning that is not accompanied by etching of the wafer becomes possible, and surface roughness and projecting defects can be improved.

Furthermore, since treatment at room temperature becomes possible by using ozone water, the apparatus makes it possible to reduce costs.

Furthermore, in this case, the ozone water filled in the ozone water tanks preferably has a concentration of 10 ppm or more.

According to such an apparatus for cleaning a semiconductor silicon wafer, wafer quality can be improved more certainly.

Advantageous Effects of Invention

According to the inventive method for cleaning a semiconductor silicon wafer and apparatus for cleaning the same, a polishing agent adhered not only to the wafer surface but also to an edge portion can be removed efficiently by rotating the wafer, and wafer quality can be improved.

In addition, cleaning that is not accompanied by etching of the wafer becomes possible, and surface roughness and projecting defects can be improved.

Furthermore, since treatment at room temperature becomes possible by using ozone water, costs can be reduced.

BRIEF DESCRIPTION OF DRAWINGS

FIG. 1 is a diagram showing an example of a flow of the present invention for cleaning a semiconductor silicon wafer after polishing.

FIG. 2 is a diagram showing an example of a conventional flow for cleaning a semiconductor silicon wafer after polishing.

FIG. 3 is a flow diagram showing a case where a step of performing a second ultrasonic-wave-ozone-water treatment of the present invention is performed twice.

FIG. 4 is a diagram showing the rotation angles of a semiconductor silicon wafer in a case where the step of performing the second ultrasonic-wave-ozone-water treatment of the present invention is performed twice.

FIG. 5 is a figure showing the haze and the number of projecting defects in semiconductor silicon wafers after cleaning in the Comparative Example and the Example.

FIG. 6 is a diagram showing an example of the inventive apparatus for cleaning a semiconductor silicon wafer.

DESCRIPTION OF EMBODIMENTS

To solve the above problems, the present inventor has earnestly studied and found out that by not using an alkaline chemical solution such as SC1, and by cleaning, with a chemical solution that is not accompanied by etching of silicon, a wafer immediately after polishing having a polishing agent adhered to the entire surface thereof in a state of being at room temperature and pH=7.0 or less, defects on the wafer can be reduced and degradation of surface roughness can be prevented.

In addition, the present inventor has found out that by employing a cleaning method (ultrasonic-wave-ozone-water treatment) using both ozone water and ultrasonic waves as a method for removing a polishing agent as a substitute for SC1, and by performing an ozone water treatment multiple times while applying ultrasonic waves with the rotation angle of the wafer changed, it is possible to achieve a surface quality superior to what is conventional.

Furthermore, the present inventor has found out that an ultrasonic-wave-ozone-water treatment leads to reduction of costs since room temperature treatment and reuse of wastewater are possible, and completed the present invention.

Hereinafter, the present invention will be specifically described. However, the present invention is not limited thereto.

Firstly, the inventive apparatus for cleaning a semiconductor silicon wafer will be described.

The inventive apparatus for cleaning a semiconductor silicon wafer is an apparatus for cleaning a semiconductor silicon wafer for cleaning a semiconductor silicon wafer after polishing, the apparatus including:

a first ozone water tank filled with ozone water for immersing, in the ozone water, the semiconductor silicon wafer after polishing;

a hydrofluoric acid tank filled with hydrofluoric acid for immersing the semiconductor silicon wafer in the hydrofluoric acid;

a second ozone water tank filled with ozone water for immersing, in the ozone water, the semiconductor silicon wafer after immersing in the hydrofluoric acid;

an ozone water tank having an ultrasonic wave application means for immersing the semiconductor silicon wafer in ozone water and cleaning while applying ultrasonic waves; and a wafer rotation means for taking the semiconductor silicon wafer out of the ozone water tank having the ultrasonic wave application means and rotating.

FIG. 6 is a diagram showing an example of the inventive apparatus for cleaning a semiconductor silicon wafer.

In the apparatus 1 for cleaning a semiconductor silicon wafer, the first ozone water tank 2 is filled with ozone water, and by immersing a semiconductor silicon wafer W immediately after polishing having a polishing agent adhered to the entire surface thereof, the polishing agent is removed by the ozone water treatment, and at the same time, an oxide film is formed on the surface of the semiconductor silicon wafer.

The ozone water tank 3 having the ultrasonic wave application means can immerse a vertically-placed semiconductor silicon wafer W in ozone water. In addition, since the ozone water tank has an ultrasonic wave application means for applying ultrasonic waves, the semiconductor silicon wafer can be immersed in the ozone water while applying ultrasonic waves.

The semiconductor silicon wafer W immersed in ozone water while applying ultrasonic waves is taken out of the ozone water tank 3 having the ultrasonic wave application means and rotated by the wafer rotation means 4, and then is transported to the next tank. Note that here, there is a plurality of ozone water tanks 3 having the ultrasonic wave application means, and the tank for immersion is changed every time the semiconductor silicon wafer W is rotated, but it is also possible to immerse the semiconductor silicon wafer W in the same tank.

The wafer rotation means 4 can rotate the semiconductor silicon wafer W by a predetermined rotation angle with the center of the wafer surface of the semiconductor silicon wafer W as a rotation center.

The hydrofluoric acid tank 5 is filled with hydrofluoric acid, and the semiconductor silicon wafer W is immersed to remove particles and metal contamination by oxide film removal with the hydrofluoric acid.

The second ozone water tank 6 is filled with ozone water, and the semiconductor silicon wafer W after immersing in the hydrofluoric acid is immersed in the ozone water, a natural oxide film is formed by the ozone water, and the surface state is finished.

According to such an apparatus for cleaning a semiconductor silicon wafer, a polishing agent adhered not only to the wafer surface but also to an edge portion can be removed efficiently by rotating the wafer, and wafer quality can be improved.

In addition, cleaning that is not accompanied by etching of the semiconductor silicon wafer can be performed, and surface roughness and projecting defects can be improved.

Furthermore, since treatment at room temperature becomes possible by using ozone water, costs can be reduced.

Furthermore, the ozone water filled in the ozone water tanks of the apparatus for cleaning a semiconductor preferably has a concentration of 10 ppm or more.

According to such an apparatus for cleaning a semiconductor silicon wafer, wafer quality can be improved more certainly.

Next, the inventive method for cleaning a semiconductor silicon wafer will be described.

The inventive method for cleaning a semiconductor silicon wafer is a method for cleaning a semiconductor silicon wafer for cleaning a semiconductor silicon wafer after polishing, the method including:

an ozone water treatment step after polishing, of immersing, in ozone water, the semiconductor silicon wafer after polishing;

a step of performing a first ultrasonic-wave-ozone-water treatment of cleaning the semiconductor silicon wafer at room temperature while immersing in ozone water and applying ultrasonic waves; and a step of performing a second ultrasonic-wave-ozone-water treatment of, after the step of performing the first ultrasonic-wave-ozone-water treatment, pulling out the semiconductor silicon wafer from the ozone water, performing a wafer rotation process of rotating, and cleaning the semiconductor silicon wafer after the wafer rotation process again at room temperature while immersing in ozone water and applying ultrasonic waves; wherein the step of performing the second ultrasonic-wave-ozone-water treatment is performed once or more times, and subsequently, a hydrofluoric acid treatment step of immersing the semiconductor silicon wafer in hydrofluoric acid and an ozone water treatment step of immersing the semiconductor silicon wafer after the hydrofluoric acid treatment step in ozone water are performed.

According to such a method for cleaning a semiconductor silicon wafer, a polishing agent adhered not only to the wafer surface but also to an edge portion can be removed efficiently by rotating the wafer, and wafer quality can be improved.

In addition, since the cleaning is not accompanied by etching of the wafer, surface roughness and projecting defects can be improved.

Furthermore, since treatment at room temperature is possible by using ozone water, costs can be reduced.

FIG. 1 is a diagram showing an example of a flow of the present invention for cleaning a semiconductor silicon wafer after polishing.

As shown in FIG. 1, an oxide film is formed by an ozone water treatment of immersing in ozone water on a semiconductor silicon wafer immediately after polishing having a polishing agent adhered to the entire surface thereof (ozone water treatment step after polishing). Then, an ozone water treatment with application of ultrasonic waves (ultrasonic-wave-ozone-water treatment) is performed at room temperature (step of performing a first ultrasonic-wave-ozone-water treatment), and [wafer rotation process→ultrasonic-wave-ozone-water treatment] (step of performing a second ultrasonic-wave-ozone-water treatment) is performed once or more times. Thus, cleaning is performed. Subsequently, a hydrofluoric acid treatment step and an ozone water treatment step are performed. In addition, it is possible to perform a pure water treatment step before the hydrofluoric acid treatment step, a pure water treatment step after the ozone water treatment step, and drying.

In the wafer rotation process, the semiconductor silicon wafer is once taken out of the ozone water tank having the ultrasonic wave application means, rotated to a predetermined rotation angle, and then transported to the next tank.

The greater the number of times to repeat the step of performing the second ultrasonic-wave-ozone-water treatment, the more the wafer quality is improved. However, when performed twice, decrease in throughput does not occur in the actual manufacturing process. Therefore, it is desirable to perform the step of performing the second ultrasonic-wave-ozone-water treatment twice.

The rotation angle of the wafer can be rotated by a predetermined rotation angle when the direction of 6 o'clock of the wafer placed vertically inside the ozone water tank having the ultrasonic wave application means is defined as 0°.

Furthermore, when the step of performing the second ultrasonic-wave-ozone-water treatment is performed "n" times, it is desirable for the rotation angle of the wafer at one time to be the angle expressed as 360°/(1+n).

FIG. 3 is a flow diagram showing that the step of performing the second ultrasonic-wave-ozone-water treatment of the present invention is performed twice. FIG. 4 is a diagram showing the rotation angles of a semiconductor silicon wafer in a case where the step of performing the second ultrasonic-wave-ozone-water treatment of the present invention is performed twice.

As shown in FIG. 3, after performing an ultrasonic-wave-ozone-water treatment (step of performing a first ultrasonic-wave-ozone-water treatment), a wafer rotation process is performed, the wafer is transported to the next ozone water tank having an ultrasonic wave application means, and an ultrasonic-wave-ozone-water treatment is performed again (step of performing a second ultrasonic-wave-ozone-water treatment). Subsequently, a wafer rotation process is performed, the wafer is further transported to the next ozone water tank having an ultrasonic wave application means, and an ultrasonic-wave-ozone-water treatment is performed (the second step of performing the second ultrasonic-wave-ozone-water treatment).

Furthermore, when the step of performing the second ultrasonic-wave-ozone-water treatment is performed twice, the rotation angle in one wafer rotation process can be 360°/(1+2)=120° as shown in FIGS. 3 and 4.

By performing such a step of performing the second ultrasonic-wave-ozone-water treatment repeatedly, ultrasonic waves can be applied uniformly, not only in the wafer surface, but also in the edge portion, and wafer quality can be further improved.

Furthermore, the semiconductor silicon wafer after polishing is preferably a semiconductor silicon wafer polished using silica as a polishing agent. In this manner, organic matter can be completely decomposed and removed by the ultrasonic-wave-ozone-water treatments, and silica can also be removed to some extent. Thereafter, silica and metal contamination can be eliminated by removing a natural oxide film by a hydrofluoric acid treatment, and lastly, a natural oxide film can be formed by ozone water to finish the surface state.

Furthermore, a pure water treatment step of immersing the semiconductor silicon wafer in pure water is preferably included, where the pure water treatment step is preferably performed at least before the hydrofluoric acid treatment step. In this manner, wafer quality can be improved more certainly. As a matter of course, the pure water treatment is not limited thereto, and can be performed between the steps or before and after each step.

Furthermore, out of waste liquids produced in the steps, waste liquids of ozone water and pure water are preferably collected and reused. In this manner, waste liquid can be reused, and this leads to cost reduction.

Furthermore, out of the steps, an ozone water concentration in the steps where ozone water is used is preferably 10 ppm or more. With such an ozone water concentration, a natural oxide film can be formed with certainty, and wafer quality can be improved more certainly.

EXAMPLE

Hereinafter, the present invention will be more specifically described with reference to an Example and a Comparative Example. However, the present invention is not limited to these Examples.

The evaluation of the semiconductor silicon wafer in the following Comparative Example and Example was performed by measuring particles on a semiconductor silicon wafer after cleaning, the particles having a diameter of 19 nm or more, by using a wafer inspection apparatus SP5 manufactured by KLA-Tencor Corporation.

EXAMPLE

According to the cleaning flow shown in FIG. 1, an oxide film was formed on a semiconductor silicon wafer immediately after polishing having an adhered polishing agent by a 180-second ozone water treatment (ozone water treatment step). Then, an ultrasonic-wave-ozone-water treatment with application of ultrasonic waves was performed for 180 seconds (step of performing a first ultrasonic-wave-ozone-water treatment), and [wafer rotation process→180-second ultrasonic-wave-ozone-water treatment] (step of performing a second ultrasonic-wave-ozone-water treatment) was performed twice. Thus, cleaning was performed. Subsequently, a pure water treatment, a 180-second hydrofluoric acid treatment step, a 180-second ozone water treatment step, a pure water treatment, and drying were performed in this order. In addition, all the steps in the Example were performed at room temperature.

The number of times of repeating the step of performing the second ultrasonic-wave-ozone-water treatment was two, and therefore, the rotation angle of the semiconductor silicon wafer at one time was 360/(1+2)=120°.

In addition, in the Example, waste liquids of ozone water and pure water out of the waste liquids produced in the steps can be collected and reused.

Out of the steps in the Example, the ozone water concentration in the steps where ozone water was used was set to 10 ppm. In addition, the hydrofluoric acid concentration of the hydrofluoric acid cleaning solution in the hydrofluoric acid treatment step was set to 1.0 mass %.

COMPARATIVE EXAMPLE

According to the cleaning flow shown in FIG. 2, a wafer after polishing having an adhered polishing agent was subjected to a pure water treatment, then an SC1 treatment with application of ultrasonic waves was performed for 180 seconds. Subsequently, a pure water treatment, a 180-second hydrofluoric acid treatment, a 180-second ozone water treatment, a pure water treatment, and drying were performed. In the SC1 cleaning solution used in the SC1 treatment, the mixing ratio of ammonia, hydrogen peroxide water, and ultrapure water was set to 1:1:10, and the temperature of the SC1 cleaning solution was set to 80° C. In addition, the concentrations of the ozone water and the hydrofluoric acid in the hydrofluoric acid treatment and the ozone water treatment were the same as in the Example.

FIG. 5 is a figure showing the haze and the number of projecting defects in semiconductor silicon wafers after cleaning in the Comparative Example and the Example.

As shown in FIG. 5, when comparing the case where the cleaning was performed under common cleaning conditions using SC1 (Comparative Example) and the case where the cleaning was performed using ozone water and ultrasonic waves (Example), the haze and the number of projecting defects were both reduced and improved in the Example.

In addition, LLS (Localized Light Scatterers) were also reduced and improved in the Example compared with the Comparative Example.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for cleaning a semiconductor silicon wafer after polishing, the method comprising:
    an ozone water treatment step after polishing, of immersing, in ozone water, the semiconductor silicon wafer after polishing;
    a step of performing a first ultrasonic-wave-ozone-water treatment of cleaning the semiconductor silicon wafer at room temperature while immersing in ozone water and applying ultrasonic waves; and
    a step of performing a second ultrasonic-wave-ozone-water treatment of, after the step of performing the first ultrasonic-wave-ozone-water treatment, pulling out the semiconductor silicon wafer from the ozone water, performing a wafer rotation process of rotating, and cleaning the semiconductor silicon wafer after the wafer rotation process again at room temperature while immersing in ozone water and applying ultrasonic waves; wherein
    the step of performing the second ultrasonic-wave-ozone-water treatment is performed once or more times, and subsequently, a hydrofluoric acid treatment step of immersing the semiconductor silicon wafer in hydrofluoric acid and an ozone water treatment step of immersing the semiconductor silicon wafer after the hydrofluoric acid treatment step in ozone water are performed.

2. The method for cleaning a semiconductor silicon wafer according to claim 1, wherein when the step of performing the second ultrasonic- wave-ozone-water treatment is performed "n" times, a rotation angle of the semiconductor silicon wafer in the wafer rotation process is $360°/(1+n)$.

3. The method for cleaning a semiconductor silicon wafer according to claim 2, wherein the step of performing the second ultrasonic-wave- ozone-water treatment is performed twice.

4. The method for cleaning a semiconductor silicon wafer according to claim 3, comprising a pure water treatment step of immersing the semiconductor silicon wafer in pure water, wherein the pure water treatment step is performed at least before the hydrofluoric acid treatment step.

5. The method for cleaning a semiconductor silicon wafer according to claim 4, wherein out of waste liquids produced in the steps, waste liquids of ozone water and pure water are collected and reused.

6. The method for cleaning a semiconductor silicon wafer according to claim 2, comprising a pure water treatment step of immersing the semiconductor silicon wafer in pure water, wherein the pure water treatment step is performed at least before the hydrofluoric acid treatment step.

7. The method for cleaning a semiconductor silicon wafer according to claim 6, wherein out of waste liquids produced in the steps, waste liquids of ozone water and pure water are collected and reused.

8. The method for cleaning a semiconductor silicon wafer according to claim 1, wherein the step of performing the second ultrasonic-wave- ozone-water treatment is performed twice.

9. The method for cleaning a semiconductor silicon wafer according to claim 8, comprising a pure water treatment step of immersing the semiconductor silicon wafer in pure water, wherein the pure water treatment step is performed at least before the hydrofluoric acid treatment step.

10. The method for cleaning a semiconductor silicon wafer according to claim 9, wherein out of waste liquids produced in the steps, waste liquids of ozone water and pure water are collected and reused.

11. The method for cleaning a semiconductor silicon wafer according to claim 1, comprising a pure water treatment step of immersing the semiconductor silicon wafer in pure water, wherein the pure water treatment step is performed at least before the hydrofluoric acid treatment step.

12. The method for cleaning a semiconductor silicon wafer according to claim 11, wherein out of waste liquids produced in the steps, waste liquids of ozone water and pure water are collected and reused.

13. The method for cleaning a semiconductor silicon wafer according to claim 1, wherein out of the steps, an ozone water concentration in the steps where ozone water is used is 10 ppm or more.

14. The method for cleaning a semiconductor silicon wafer according to claim 1, wherein the semiconductor silicon wafer after polishing is a semiconductor silicon wafer polished using silica as a polishing agent.

* * * * *